(12) United States Patent
Taketomi et al.

(10) Patent No.: US 10,392,558 B2
(45) Date of Patent: Aug. 27, 2019

(54) METHOD OF PRODUCING ALUMINATE FLUORESCENT MATERIAL, ALUMINATE FLUORESCENT MATERIAL AND LIGHT EMITTING DEVICE

(71) Applicant: NICHIA CORPORATION, Anan-shi, Tokushima (JP)

(72) Inventors: Shozo Taketomi, Tokushima (JP); Shoji Hosokawa, Tokushima (JP); Tomokazu Yoshida, Anan (JP); Kazuya Nishimata, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/704,689

(22) Filed: Sep. 14, 2017

(65) Prior Publication Data

US 2018/0086975 A1    Mar. 29, 2018

(30) Foreign Application Priority Data

Sep. 28, 2016  (JP) ................. 2016-189311

(51) Int. Cl.
*C09K 11/64* (2006.01)
*H01L 33/50* (2010.01)

(52) U.S. Cl.
CPC .......... *C09K 11/643* (2013.01); *H01L 33/502* (2013.01); *H01L 33/505* (2013.01); *H01L 2224/48247* (2013.01); *H01L 2224/48257* (2013.01); *H01L 2224/73265* (2013.01)

(58) Field of Classification Search
None
See application file for complete search history.

(56) References Cited

FOREIGN PATENT DOCUMENTS

| JP | 2004155907 A | 6/2004 |
|----|--------------|--------|
| JP | 2008050390 A | 3/2008 |
| JP | 2009065145 A | 3/2009 |
| JP | 2009094231 A | 4/2009 |
| JP | 2015-078334 A | 4/2015 |

OTHER PUBLICATIONS

S. Okamoto et al., "Photoluminescence Properties of BaMgAl10O17 Doped with High Concentration of Mn2+ for Blue-LED-BASED Solid State Lighting," Journal of the Electrochemical Society, 158(11), J363-J367, 2011, 5 pages.

*Primary Examiner* — Long Pham
(74) *Attorney, Agent, or Firm* — Hunton Andrews Kurth LLP

(57) ABSTRACT

Provided are a method of producing an aluminate fluorescent material, an aluminate fluorescent material and a light emitting device. The production method includes heat-treating a mixture prepared by mixing a compound containing at least one alkaline earth metal element selected from the group consisting of Ba, Sr and Ca, a Mg-containing compound not acting as a flux, a Mn-containing compound, an Al-containing compound, a first flux containing at least one alkali metal element selected from the group consisting of Na, K, Rb and Cs, and a Mg-containing second flux to give an aluminate fluorescent material.

9 Claims, 6 Drawing Sheets

METHOD OF PRODUCING ALUMINATE FLUORESCENT MATERIAL, ALUMINATE FLUORESCENT MATERIAL AND LIGHT EMITTING DEVICE

CROSS-REFERENCE TO RELATED PATENT APPLICATION

The present application claims priority under 35 U. S. C. § 119 to Japanese Patent Application No. 2016-189311, filed Sep. 28, 2016, the disclosure of which is hereby incorporated by reference in its entirety.

BACKGROUND

Technical Field

The present disclosure relates to a method of producing an aluminate fluorescent material, to an aluminate fluorescent material and to a light emitting device.

Description of Related Art

Various light emitting devices that emit white light, bulb color light, orange light by combination of a light emitting diode (LED) and a fluorescent material have been developed. In these light emitting devices, a desired luminescent color can be obtained according to the principle of light color mixing. As a light emitting device, one that emits white light by combination of a light emitting element to emit blue color as an excitation light source, and a fluorescent material to emit green color and a fluorescent material to emit red color when excited by the light from the light source, is known.

Use of these light emitting devices in a broad field of ordinary lightings, in-car lightings, displays, backlights for liquid crystals and others is being promoted.

As a fluorescent material to emit green color for use in light emitting devices, for example, in Japanese Unexamined Patent Publication No. 2004-155907 discloses a manganese-activated aluminate fluorescent material having a composition represented by $(Ba, Sr)MgAl_{10}O_{17}:Mn^{2+}$.

SUMMARY

However, the manganese-activated aluminate fluorescent material disclosed in Japanese Unexamined Patent Publication No. 2004-155907 is, when combined with a light emitting element that emits light having an emission peak wavelength in a range of 380 nm or more and 485 nm or less (hereinafter this may be referred to as "near-UV to blue region"), insufficient in emission intensity.

Consequently, an embodiment of the present disclosure is to provide a method of producing an aluminate fluorescent material capable of emitting green color having a high emission intensity through excitation in a near-UV to blue region, and to provide an aluminate fluorescent material and a light emitting device.

The means for solving the above-mentioned problem is as described below, and the present disclosure includes the following aspects.

A first embodiment of the present disclosure provides a method of producing a fluorescent material that includes heat-treating a mixture prepared by mixing a compound containing at least one alkaline earth metal element selected from the group consisting of Ba, Sr and Ca, a Mg-containing compound not acting as a flux, a Mn-containing compound, an Al-containing compound, a first flux containing at least one alkali metal element selected from the group consisting of Na, K, Rb and Cs, and a Mg-containing second flux thereby to obtain the fluorescent material.

A second embodiment of the present disclosure provides an aluminate fluorescent material comprising a composition of an aluminate that contains at least one alkaline earth metal element selected from the group consisting of Ba, Sr and Ca, at least one alkali metal element selected from the group consisting of Na, K, Rb and Cs, and Mg and Mn, and having a ratio $(I_B/I_A)$ of a diffraction intensity $I_B$ of a peak of a plane (0,0,10) in an X-ray diffraction pattern measured with a CuKα ray to a diffraction intensity $I_A$ of a peak of a plane (1,0,7) in the X-ray diffraction pattern in a range of 0.4 or more and 10 or less.

A third embodiment of the present disclosure provides a light emitting device provided with an aluminate fluorescent material and an excitation light source having an emission peak wavelength in a range of 380 nm or more and 485 nm or less.

According to embodiments of the present disclosure, an aluminate fluorescent material that emits green color and has high emission intensity, a method of producing the aluminate fluorescent material, and a light emitting device can be provided.

DETAILED DESCRIPTION

Figure 1:
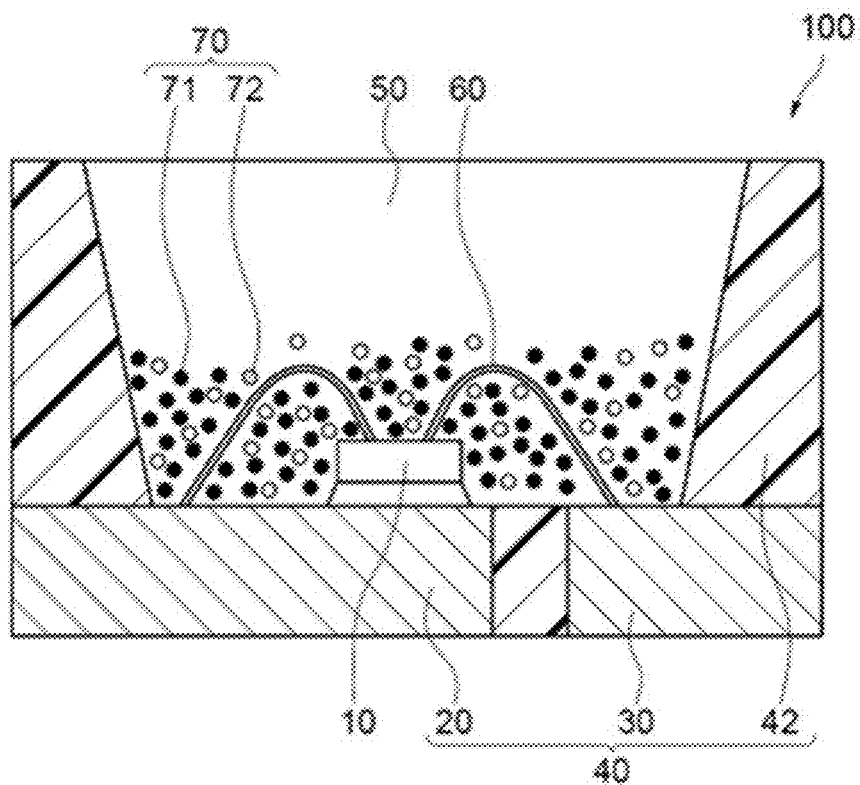
FIG. 1 is a schematic cross-sectional view showing an example of a light emitting device according to an embodiment of the present disclosure.

A production method of an aluminate fluorescent material, the aluminate fluorescent material and the light emitting device using it, as disclosed herein, are described with reference to embodiments of the present disclosure. The embodiments shown below are exemplifications to embody the technical ideas of the present disclosure, and the present invention is not limited to the aluminate fluorescent material, its production method and the light emitting device disclosed below. The relationship between the color name and the chromaticity coordinate, the relationship between the wavelength range of light and the color name of monochromatic color and others are in accordance with JIS Z8110. The content of each component in the composition is, in the case where plural substances corresponding to each component exist in the composition and unless otherwise specifically indicated, to mean the total amount of the plural substances existing in the composition.

First, the aluminate fluorescent material of an embodiment of the present disclosure is described.

Aluminate Fluorescent Material

The aluminate fluorescent material of an embodiment of the present disclosure has a composition of an aluminate that contains at least one alkaline earth metal element selected from the group consisting of Ba, Sr and Ca, at least one alkali metal element selected from the group consisting of Na, K, Rb and Cs, and Mg and Mn, and has a ratio ($I_B/I_A$) of a diffraction intensity $I_B$ of a peak of a plane (0,0,10) in an X-ray diffraction pattern measured with a CuKα ray to a diffraction intensity $I_A$ of a peak of a plane (1,0,7) in the X-ray diffraction pattern in a range of 0.4 or more and 10 or less.

The aluminate fluorescent material of this embodiment has a hexagonal crystal structure and has peaks at the same positions as those shown in ICDD data No. 00-026-0163 of $BaMgAl_{10}O_{17}$ in International Center for Diffraction. Specifically, in an X-ray diffraction pattern measured using a CuKα ray, the aluminate fluorescent material has a peak at 2θ of 33.22° (1,0,7) and a peak at 2θ of 39.76° (0,0,10).

In the X-ray diffraction pattern, as measured using a CuKα ray, of the aluminate fluorescent material of this embodiment, the diffraction intensity in the c-axis direction is higher than the diffraction intensity at the same position of $BaMgAl_{10}O_{17}$ shown in the ICDD data.

The aluminate fluorescent material of this aspect contains an alkali metal element in the hexagonal crystal structure and therefore the crystal thereof grows in the c-axis direction, and accordingly it is presumed that the emission intensity of the aluminate fluorescent material could be high.

In the X-ray diffraction pattern, as measured using a CuKα ray, of the aluminate fluorescent material of this aspect, the ratio ($I_B/I_A$) of a diffraction intensity Is of a peak of a plane (0,0,10) thereof to a diffraction intensity $I_A$ of a peak of a plane (1,0,7) ($I_B/I_A$) is in a range of 0.4 or more and 10 or less. The $I_B/I_A$ ratio of the aluminate fluorescent material of this embodiment is preferably in a range of 0.45 or more and 8.0 or less, more preferably in a range of 0.48 or more and 7.5 or less, even more preferably in a range of 0.50 or more and 7.0 or less.

When the $I_B/I_A$ ratio of the aluminate fluorescent material of this embodiment is less than 0.4, the crystal growth in the c-axis direction is not sufficient and the emission intensity could not be high. When the $I_B/I_A$ ratio of the aluminate fluorescent material of this aspect is more than 10, the crystal grows too much in the c-axis direction therefore producing defects in the crystal structure, and if so, the emission intensity would rather decrease.

Preferably, the aluminate fluorescent material of this embodiment has an alkali metal element content of 20 ppm or more and 3,000 ppm or less.

The aluminate fluorescent material of this embodiment contains an alkali metal element in the amount mentioned above in the hexagonal crystal structure thereof, and therefore the crystal grows in the c-axis direction to increase the emission intensity. The alkali metal element content in the aluminate fluorescent material of this aspect is more preferably in a range of 25 ppm or more and 2,500 ppm or less, even more preferably in a range of 25 ppm or more and 2,000 ppm or less, even more preferably in a range of 25 ppm or more and 1,500 ppm or less.

Preferably, the aluminate fluorescent material of this embodiment has a composition represented by the following formula (I):

$$X1_a X2_e Mg_b Mn_c Al_d O_{a+b+c+1.5d+0.5e} \quad (I)$$

wherein X1 represents at least one alkaline earth metal element selected from the group consisting of Ba, Sr and Ca, X2 represents at least one alkali metal element selected from the group consisting of Na, K, Rb and Cs, and a, b, c, d and e each are numbers satisfying 0.5≤a≤1.0, 0.4≤b≤0.7, 0.3≤c≤0.7, 0.7≤b+c≤1.0, 9.0≤d≤13.0, 10.0≤d/a≤20.0, and 0.0<e≤0.1.

The aluminate fluorescent material of this embodiment preferably contains Ba as the alkaline earth metal element. In the formula (I), X1 preferably contains Ba. When the aluminate fluorescent material of one aspect of the present invention contains Ba as the alkaline earth metal element, the emission intensity could be higher.

The aluminate fluorescent material of this embodiment preferably contains Na and/or K as the alkali metal element. In the formula (I), X2 preferably contains Na and/or K. When the aluminate fluorescent material of an embodiment of the present disclosure contains Na or K as the alkali metal element, the emission intensity could be higher.

Regarding the aluminate fluorescent material of this embodiment, the aluminate fluorescent material having a composition represented by the formula (I) may be referred to as "aluminate florescent material (I)" for convenience sake. In the aluminate fluorescent material (I), a indicates the total molar compositional ratio of at least one alkaline earth metal element selected from the group consisting of Ba, Sr and Ca. In the case where the subscript a in the formula (I) is a number satisfying 0.5≤a≤1.0, the crystal structure is stable and the emission intensity can increase. The subscript a preferably satisfies 0.60≤a≤1.0, more preferably 0.70≤a≤1.0.

In the aluminate fluorescent material (I), the subscript b is a molar compositional ratio of Mg, and when the subscript b is a number satisfying 0.4≤b≤0.7, the material has an emission peak in a range of 485 nm or more and 570 nm or less, and the relative emission intensity of the emission peak can be higher. The subscript b preferably satisfies 0.45≤b≤0.65, more preferably 0.46≤b≤0.60. When the subscript b in the aluminate fluorescent material (I) satisfies 0.4≤b≤0.7, the emission spectrum of the material by excitation in a near-UV to blue region can have an emission peak in a range of 485 nm or more and 570 nm or less, and the relative emission intensity of the emission peak can be higher.

In the aluminate fluorescent material (I), the subscript c is a molar compositional ratio of Mn, and when the subscript c satisfies 0.3≤c≤0.7 and, for example, when the material is excited with light falling in a near-UV to blue region, the emission intensity can increase. The manganese-activated aluminate fluorescent material disclosed in Japanese Unexamined Patent Publication No. 2004-155907 has a low emission intensity in excitation in a near-UV to blue region, and the reason would be because the absorption of light in a near-UV to blue region of the manganese-activated aluminate fluorescent material disclosed in Japanese Unexamined Patent Publication No. 2004-155907 is lower than the vacuum UV absorption thereof. In the case where the aluminate fluorescent material (I) is excited with light in a near-UV to blue region and, for example, when the Mn activation amount thereof is increased more than the Mn activation amount of the manganese-activated aluminate fluorescent material disclosed in Japanese Unexamined Patent Publication No. 2004-155907, the light absorption by the aluminate fluorescent material (I) in a near-UV to blue region can increase and therefore the material can maintain a high emission intensity. The subscript c indicating the molar compositional ratio of the Mn activation amount preferably satisfies 0.35≤c≤0.65, more preferably 0.40≤c≤0.60, even more preferably 0.45≤c≤0.55. It is considered that Mn could be substituted in the Mg site in the hexagonal crystal structure.

In the aluminate fluorescent material (I), the total of the subscript b indicating the molar compositional ratio of Mg and the subscript c indicating the molar compositional ratio of Mn preferably satisfies 0.7b+c≤1.0. The total of the subscript b and the subscript more preferably satisfies 0.75≤b+c≤1.00, even more preferably 0.80≤b+c≤1.00.

In the aluminate fluorescent material (I), the subscript d is a molar compositional ratio of Al, and when d in formula (I) satisfies 9.0≤d≤13.0, the crystal structure is stable and the emission intensity can be maintained high.

The subscript d more preferably satisfies 9.0≤d≤12.5, even preferably 9.0≤d≤12.0.

In the aluminate fluorescent material (I), the ratio of a indicating the molar compositional ratio of the alkaline earth metal element to the subscript d indicating the molar compositional ratio of Al (d/a) preferably satisfies 10.0≤d/a≤20.0. When the ratio of d/a satisfies 10.0≤d/a, the crystal structure is stable and the emission intensity can be maintained high. The ratio d/a more preferably satisfies 10.0≤d/a≤19.0, even more preferably 10.0≤d/a≤18.0.

In the aluminate fluorescent material (I), the subscript e is a molar compositional ratio of the alkali metal element, and the subscript e satisfies 0.0<e≤0.1. The aluminate florescent material of this embodiment contains an alkali metal element in the molar compositional ratio represented by the subscript e in the hexagonal crystal structure of the aluminate fluorescent material, and therefore the crystal thereof grows in the c-axis direction and the emission intensity of the material can be higher. More preferably, e satisfies 0.0001≤e≤0.0950, even more preferably 0.0002≤e≤0.0930, still more preferably 0.0003≤e≤0.0900.

The average particle diameter of the aluminate fluorescent material of this embodiment is preferably 5.0 μm or more. The average particle diameter of the aluminate fluorescent material of this embodiment is preferably 35.0 μm or less, more preferably in a range of 10.0 μm or more and 30.0 μm or less, even more preferably in a range of 11.0 μm or more and 25.0 μm or less, still more preferably in a range of 12.0 μm or more and 25.0 μm or less. When the average particle diameter of the aluminate fluorescent material of this embodiment falls within the above range, the emission intensity can be higher. The average particle diameter of the fluorescent material is a particle diameter that reaches 50% volume cumulative frequency from the small particle diameter side measured with a laser diffractometric particle sizer (for example, MASTER SIZER 3000 manufactured by Malvern Instruments Ltd.) (D50: median diameter).

The aluminate fluorescent material of this embodiment is activated by manganese (Mn) and emits green light through excitation in a near-UV to blue region. Specifically, the aluminate fluorescent material of an embodiment of the present invention absorbs light in a wavelength range of 380 nm or more and 485 nm or less, and in the emission spectrum thereof, the emission peak wavelength falls preferably in a range of 485 nm or more and 570 nm or less, more preferably in a range of 505 nm or more and 550 nm or less, even more preferably in a range of 515 nm or more and 523 nm or less.

In excitation in a near-UV to blue region of the aluminate fluorescent material of this embodiment, for example, the full-width at half-maximum of the emission peak wavelength in the emission spectrum excited with light of 450 nm is preferably 45 nm or less, more preferably 40 nm or less, even more preferably 35 nm or less. As a fluorescent material that emits green light through excitation in a near-UV to blue region, for example, a β-sialon fluorescent material activated by europium (Eu) is known. The full-width at half-maximum of the emission peak wavelength in the emission spectrum of the β-sialon fluorescent material irradiated with light having an excitation wavelength of 450 nm is 50 nm or so, and the full-width at half-maximum of the aluminate fluorescent material of this aspect of the present disclosure is narrower than this. The full-width at half-maximum of the emission peak in the emission spectrum of the aluminate fluorescent material of this embodiment is narrow, and therefore the color purity thereof is high. A light emitting device using the aluminate fluorescent material of this embodiment is, when used as a backlight for liquid crystals, able to broaden the color reproduction range of the liquid-crystal display device.

Next, the light emitting device using the aluminate fluorescent material of another embodiment of the present disclosure is described.

Light Emitting Device

The light emitting device of an embodiment of the present disclosure is provided with the above-mentioned aluminate fluorescent material and an excitation light source having an emission peak wavelength in a range of 380 nm or more and 485 nm or less. An example of the light emitting device using the fluorescent material is described with reference to a drawing. FIG. 1 is a schematic cross-sectional view showing a light emitting device 100 of this embodiment.

The light emitting device 100 is provided with a molded article 40, a light emitting element 10 and a fluorescent member 50. The molded article 40 is integrally composed of a first lead 20, a second lead 30 and a resin part 42 containing a thermoplastic resin or a thermosetting resin. The molded article 40 forms a recess part having a bottom face and a side face, and the light emitting element 10 is mounted on the bottom face of the recess part. The light emitting element 10 has a pair of positive and negative electrodes, and the pair of positive and negative electrodes each are individually electrically connected to the first lead 20 and the second lead 30 each via a wire 60. The light emitting element 10 is covered with the fluorescent member 50. The fluorescent member 50 contains, for example, a fluorescent material 70 for wavelength conversion of the light from the light emitting element 10, and a resin. Further, the fluorescent material 70 contains a first fluorescent material 71 and a second fluorescent material 72. The first lead 20 and the second lead 30 connected to the pair of positive and negative electrodes of the light emitting element 10 are partly exposed toward the outside of the package to constitute the light emitting device 100. Via these first lead 20 and second lead 30, the light emitting device 100 receives external power to emit light.

The light emitting element 10 is used as an excitation light source, and preferably has an emission peak wavelength in a range of 380 nm or more and 485 nm or less. The range of the emission peak wavelength of the light emitting element 10 is preferably in a range of 390 nm or more and 480 nm or less, more preferably in a range of 420 nm or more and 470 nm or less. The above-mentioned aluminate fluorescent material is efficiently excited by the light from the excitation light source having an emission peak wavelength in a range of 380 nm or more and 485 nm or less, and has a high emission intensity, and therefore can constitute the light emitting device 100 that emits mixed light of the light from the light emitting element 10 and the fluorescent light from the fluorescent material 70.

As the light emitting element 10, for example, it is preferable to use a semiconductor light emitting element using a nitride semiconductor ($In_xAl_yGa_{1-X-Y}N$, $0\leq X$, $0\leq Y$, $X+Y\leq 1$). The full-width at half-maximum of the emission spectrum of the light emitting element 10 can be, for example, 30 nm or less. By using a semiconductor light emitting element as a light source, a stable and highly-efficient light emitting device having a high output-to-input linearity and resistant to mechanical impact can be constructed.

The light emitting device 100 includes at least the above-mentioned aluminate fluorescent material.

The first fluorescent material 71 contains mainly the above-mentioned aluminate fluorescent material and is contained in, for example, the fluorescent member 50 that covers the light emitting element 10. In the light emitting device 100 in which the light emitting element 10 is covered by the fluorescent member 50 that contains the first fluorescent material 71, a part of the light released from the light emitting element 10 is absorbed by the aluminate fluorescent material and is thereby emitted as green light. Using the light emitting element 10 that emits light having an emission peak wavelength in a range of 380 nm or more and 485 nm or less, a light emitting device having a high emission efficiency can be provided.

The content of the first fluorescent material 71 is, for example, 10 parts by mass or more and 200 parts by mass or less relative to the resin (100 parts by mass) and is preferably 2 parts by mass or more and 40 parts by mass or less.

Preferably, the fluorescent member 50 contains the second fluorescent material 72 whose emission peak wavelength differs from that of the first fluorescent material 71. For example, the light emitting device 100 is adequately provided with the light emitting element 10 that emits light having an emission peak wavelength in a range of 380 nm or more and 485 nm or less, and with the first fluorescent material 71 and the second fluorescent material 72 that are excited by the light, and therefore can have a broad color reproducibility range and good color rendering properties.

The second fluorescent material 72 may be any one that absorbs light from the light emitting element 10 for wavelength conversion into light having a different wavelength of the first fluorescent material 71. Examples thereof include $(Ca, Sr, Ba)_2SiO_4$:Eu, $(Ca, Sr, Ba)_8MgSi_4O_{16}(F, Cl,Br)_2$:Eu, $(Si,Al)_6(O,N)_8$:Eu(ß-sialon), $(Sr, Ba, Ca)Ga_2S_4$:Eu, $(Lu, Y, Gd, Lu)_3(Ga,Al)_5O_{12}$:Ce, $(La,Y, Gd)_3Si_6N_{11}$:Ce, $Ca_3Sc_2Si_{13}O_{12}$:Ce, $CaSc_4O_4$:Ce, $K_2(Si, Ge,Ti)F_6$:Mn, $(Ca, Sr, Ba)_2Si_5N_8$:Eu, $CaAlSiN_3$:Eu, $(Ca, Sr)AlSiN_3$:Eu, $(Sr, Ca)LiAl_3N_4$:Eu, $(Ca, Sr)_2Mg_2Li_2Si_2N_6$:Eu, $3.5MgO \cdot 0.5MgF_2 \cdot GeO_2$:Mn, etc.

In the case where the fluorescent member 50 further contains the second fluorescent material 72, the second fluorescent material 72 is preferably a red fluorescent material to emit a red color, and preferably absorbs light falling within a wavelength range of 380 nm or more and 485 nm or less, and emits light falling within a wavelength in a range of 610 nm or more and 780 nm or less. Containing the red fluorescent material, the light emitting device can be more favorably applied to lighting systems, liquid crystal display devices, etc. Examples of the red fluorescent material include a tetravalent Mn-activated fluorescent material having a compositional formula represented by $K_2SiF_6$:Mn, $3.5MgO \cdot 0.5MgF_2 \cdot GeO_2$:Mn, a divalent Eu-activated nitride fluorescent material represented by $CaSiAlN_3$:Eu, $(Ca,Sr)AlSiN_3$:Eu, $SrLiAl_3N_4$:Eu, etc. Among these, the red fluorescent material is, from the viewpoint of increasing the color purity and broadening the color reproducibility range, preferably a tetravalent Mn-activated fluoride fluorescent material exhibiting a full-width at half-maximum of the emission spectrum that is 20 nm or less.

The first fluorescent material 71 and the second fluorescent material 72 (the two may be simply referred to as "fluorescent material 70" as combined), along with a sealant material, may constitute the fluorescent member 50 that covers the light emitting element. Examples of the sealant material to constitute the fluorescent member 50 include a silicone resin, an epoxy resin, etc.

The total content of the fluorescent material 70 in the fluorescent member 50 may be, for example, in a range of 5 parts by mass or more and 300 parts by mass or less, relative to the resin (100 parts by mass), and is preferably in a range of 10 parts by mass or more and 250 parts by mass or less, even more preferably in a range of 15 parts by mass or more and 230 parts by mass or less, still more preferably in a range of 15 parts by mass or more and 200 parts by mass or less. When the total content of the fluorescent material in the fluorescent member 50 falls within the range, the light emitted by the light emitting element 10 can be efficiently processed for wavelength conversion by the fluorescent material 70.

The fluorescent member 50 may further contain a filler or a light diffuser in addition to the sealant material and the fluorescent material 70. For example, containing a light diffuser, the member can relieve the directionality from the light emitting element 10 and can therefore enlarge the viewing angle. Examples of the filler include silica, titanium oxide, zinc oxide, zirconium oxide, alumina, etc. In the case where the fluorescent member 50 contains a filler, the filler content may be, for example, in a range of 1 part by mass or more and 20 parts by mass or less relative to the resin (100 parts by mass).

Next, a method of producing an aluminate fluorescent material of an embodiment of the present disclosure is described.

Method of Producing Aluminate Fluorescent Material

A method of producing an aluminate fluorescent material of an embodiment of the present disclosure includes heat-treating a mixture prepared by mixing a compound containing at least one alkaline earth metal element selected from the group consisting of Ba, Sr and Ca (hereinafter this may be referred to as "alkaline earth metal element-containing compound"), a Mg-containing compound not acting as a flux, a Mn-containing compound, an Al-containing compound, a first flux containing at least one alkali metal element selected from the group consisting of Na, K, Rb and Cs, and a Mg-containing second flux thereby to give an aluminate fluorescent material.

Compound Containing Alkaline Earth Metal Element

Examples of the compound containing at least one alkaline earth metal element selected from the group consisting of Ba, Sr and Ca include oxides, hydroxides, carbonates, nitrates, sulfates, carboxylates, halides, nitrides containing at least one alkaline earth metal element selected from the group consisting of Ba, Sr and Ca. These compounds may be in the form of hydrates thereof. Specifically, the compounds include $BaO$, $Ba(OH)_2 \cdot 8H_2O$, $BaCO_3$, $Ba(NO_3)_2$, $BaSO_4$, $Ba(OCO)_2 \cdot 2H_2O$, $Ba(OCOCH_3)_2$, $BaCl_2 \cdot 6H_2O$, $Ba_3N_2$, $BaNH$, $SrO$, $Sr(OH)_2 \cdot 8H_2O$, $SrCO_3$, $Sr(NO_3)_2 \cdot 4H_2O$, $SrSO_4$, $Sr(OCO)_2 \cdot H_2O$, $Sr(OCOCH_3)_2 \cdot 0.5H_2O$, $SrCl_2 \cdot 6H_2O$, $Sr_2N$, $SrN$, $Sr_3N_2$, $SrNH$, $CaO$, $Ca(OH)_2$, $CaCO_3$, $Ca(NO_3)_2$, $CaSO_4$, $Ca(OCO)_2$, $CaCl_2$, $Ca_3N_2$, etc. One alone or two or more kinds of these compounds may be used either singly or as combined. Among these, carbonates and oxides are preferred from the viewpoint of easy handlability. Carbonates are more preferred as they are stable in air, readily decompose by heating, hardly leave any other element than the intended composition and readily prevent emission intensity reduction to be caused by residual impurity elements.

As the alkaline earth metal element-containing compound, use of a Ba-containing compound is preferred. Using a Ba-containing compound, an aluminate fluorescent material having a stable crystal structure and having an increased emission intensity can be produced. As the alkaline earth metal element-containing compound, use of a Ba-containing carbonate is preferred, and use of $BaCO_3$ is preferred.

In the production method for an aluminate fluorescent material of this aspect, an Sr-containing compound may be used. In the production method of this embodiment, use of a Sr-containing carbonate is preferred, and use of $SrCO_3$ is preferred.

In the production method of this aspect, a Ba-containing compound and a Sr-containing compound may be used as combined.

Magnesium-Containing Compound not Acting as Flux

Examples of the magnesium-containing compound not acting as a flux include a Mg-containing oxide. Specifically, the compound may include magnesium oxide (MgO). Using a Mg-containing oxide as a Mg source for one element to constitute the skeleton of the crystal structure of an aluminate fluorescent material, an aluminate fluorescent material having a stable crystal structure can be obtained. In addition, a Mg-containing compound, specifically magnesium oxide (MgO) is stable in air, readily decomposes by heating, hardly leaves any other element than the intended composition and readily prevents emission intensity reduction to be caused of residual impurity elements.

Manganese-Containing Compound

Examples of the manganese-containing compound include Mn-containing oxides, hydroxides, carbonates, nitrates, sulfates, carboxylates, halides, nitrides, etc. These manganese-containing compounds may be in the form of hydrates. Specific examples thereof include $MnO_2$, $Mn_2O_2$, $Mn_3O_4$, MnO, $Mn(OH)_2$, $MnCO_3$, $Mn(NO_3)_2$, $Mn(OCOCH_3)_2 \cdot 2H_2O$, $Mn(OCOCH_3)_3 \cdot nH_2O$, $MnCl_2 \cdot 4H_2O$, etc. One alone or two or more kinds of the Mn-containing compounds may be used either singly or as combined. Among these, from the viewpoint of easiness in handling, carbonates and oxides are preferred. A Mn-containing carbonate ($MnCO_3$) is more preferred as it is stable in air, it can readily decompose by heating, any other element than those of the intended composition hardly remain, and it is easy to prevent emission intensity reduction owing to residual impurity elements.

Aluminum-Containing Compound

Examples of the aluminum-containing compound include Al-containing oxides, hydroxides, nitrides, oxynitrides, fluorides, chlorides, etc. These compounds may be hydrates. As the aluminum-containing compound, an aluminum metal elementary substance or an aluminum alloy may also be used or the metal elementary substance or the alloy may be used for at least a part of the compound to be used.

Specific examples of the Al-containing compound include $Al_2O_3$, $Al(OH)_3$, AlN, AlON, $AlF_3$, $AlCl_3$, etc. One alone or two or more kinds of the Al-containing compounds may be used either singly or combined. The Al-containing compound is preferably an oxide ($Al_2O_3$). As compared with any other material, the oxide does not contain any other element than those of the intended composition of the aluminate fluorescent material, and can readily give the fluorescent material having a desired composition. In addition, in the case where a compound having any other element than those to be the intended composition is used, residual impurity elements may remain in the resultant fluorescent material, and the residual impurity elements may be killer factors against light emission and the emission intensity would be thereby noticeably lowered.

Flux

In the production method of an aluminate fluorescent material of an embodiment of the present disclosure, a first flux containing at least one alkali metal element selected from the group consisting of Na, K, Rb and Cs and a Mg-containing second flux are mixed in the mixture of raw materials.

Containing the fluxes, the reaction of the raw materials of the mixture is promoted to realize more uniform solid-phase reaction. This is considered to be because the heat-treatment temperature for the mixture is nearly the same as the liquid phase formation temperature for the first flux and the second flux, or is higher than the liquid phase formation temperature, and the reaction could be thereby promoted.

By mixing both fluxes of the first flux containing an alkali metal element and the Mg-containing second flux, the crystal can be grown to produce an aluminate fluorescent material having a large average particle diameter of 5.0 μm or more and having a high emission intensity.

In the production method of this embodiment, by mixing the first flux that contains at least one alkali metal element selected from the group consisting of Na, K, Rb and Cs in the system, the crystal can be grown in the c-axis direction in the hexagonal crystal structure to give an aluminate fluorescent material having a high emission intensity.

First Flux

The first flux is a compound containing at least one alkali metal element selected from the group consisting of Na, K, Rb and Cs. Examples of the first flux include halides, carbonates, nitrates, hydroxides and the like containing an alkali metal element. Above all, as the first flux, a halide or carbonate containing an alkali metal element is preferred, and among the alkali metal element-containing halide, a fluoride is preferred. Specifically, examples of the compound include NaF, NaCl, $Na_2CO_3$, KF, KCl, $K_2CO_3$, RbF, RbCl, $Rb_2CO_3$, CsF, CsCl, $Cs_2CO_3$, etc. One alone or two or more kinds of these compounds may be used either singly or as combined. As the first flux, use of a fluoride or carbonate containing at least one alkali metal element selected from the group consisting of Na, K, Rb and Cs, which has a low melting point and which facilitates crystal growth in a c-axis direction, is preferred.

In the production method of an aluminate fluorescent material of this embodiment, use of an Na-containing compound and/or a K-containing compound is preferred as the first flux containing an alkali metal element. The Na-containing compound and/or the K-containing compound have a lower melting point than the compound that contains any other alkali metal element and facilitate crystal growth in the c-axis direction in the hexagonal crystal structure of an aluminate fluorescent material.

In the production method of an aluminate fluorescent material of this embodiment, the content of the first flux is preferably in a range of 0.2 mol % or more and less than 30 mol % relative to the molar amount, 100 mol %, of the alkaline earth metal element to be contained in the mixture, more preferably in a range of 0.5 mol % or more and 25 mol % or less, even more preferably in a range of 0.5 mol % or more and 20 mol % or less. The first flux content falling within the range may facilitate crystal growth in the c-axis direction in the hexagonal crystal structure of an aluminate fluorescent material, therefore realizing production of an aluminate fluorescent material having a high emission intensity. When the first flux content in the mixture is too large, the emission intensity may decrease.

Second Flux

In the production method of an aluminate fluorescent material of this embodiment, a Mg-containing second flux is used.

By using the first flux containing an alkali metal element and the Mg-containing second flux, the reaction of the raw materials in the mixture is promoted to lead crystal growth, thereby producing an aluminate fluorescent material having a large average particle diameter of 5.0 μm or more.

When the amount of the alkali metal element-containing first flux is too large, the emission intensity of the resultant aluminate fluorescent material may decrease. Consequently, for suppressing the amount of the first flux and in place of a part of the alkali metal element-containing first flux, the second flux that contains Mg to constitute the crystal structure of the aluminate fluorescent material is used. Accordingly, the emission intensity can be prevented from decreasing and the crystal growth can be promoted, and consequently, an aluminate fluorescent material having a large particle size and having a high emission intensity can be thereby produced.

In the production method of this embodiment, the molar amount of Mg in the Mg-containing compound not acting as a flux is preferably in a range of 0 mol % or more and 69 mol % or less relative to the molar amount, 100 mol % of the alkaline earth metal element contained in the mixture, and the molar amount of Mg in the Mg-containing second flux is preferably in a range of 1 mol % or more and 70 mol % or less. More preferably, the molar amount of Mg in the Mg-containing compound not acting as a flux is in a range of 10 mol % or more and 65 mol % or less relative to the molar amount, 100 mol % of the alkaline earth metal element contained in the aluminate fluorescent material, even more preferably in a range of 20 mol % or more and 60 mol % or less, and the molar amount of Mg in the Mg-containing second flux is more preferably in a range of 5 mol % or more and 60 mol % or less, even more preferably in a range of 10 mol % or more and 50 mol % or less.

In the aluminate fluorescent material obtained according to the production method of this embodiment, Mg is an element to be the skeleton to constitute the crystal structure. In the production method of this embodiment, by using a compound not acting as a flux and a compound acting as a flux as the raw material compounds containing elements to constitute the skeleton of the crystal structure, crystal growth can be promoted and an aluminate fluorescent material having a large particle size can be produced.

When the molar amount of Mg in the Mg-containing compound not acting as a flux, and the molar amount of Mg of the Mg-containing second flux fall within the respective ranges described above taking the molar amount of alkaline earth metal element contained in the mixture as 100 mol %, the crystal structure can be stabilized, and crystal growth can be promoted, and therefore an aluminate fluorescent material having a large article size can be produced.

In the production method of this embodiment, as the Mg-containing second flux, a Mg-containing compound can be used. Examples of the Mg-containing compound include Mg-containing halides, carbonates, nitrates, sulfates and hydroxides. The Mg-containing compound for use as the Mg-containing second flux may be in the form of hydrates. Specifically, examples of the compound include $MgF_2$, $MgCl_2$, $MgCO_3$, $Mg(NO_3)_2$, $MgSO_4$, $Mg(OH)_2$, etc. One alone or two or more kinds of the compounds of the Mg-containing second flux may be used either singly or as combined. Among these, from the viewpoint of stabilizing the crystal structure of the resultant aluminate fluorescent material, a Mg-containing halide is preferred. In particular, as the Mg-containing second flux, use of magnesium fluoride is preferred.

In the production method for an aluminate fluorescent material of this embodiment where magnesium fluoride is used as the second flux, the content of magnesium fluoride is preferably in a range of 1 mol % or more and 70 mol % or less relative to the molar amount, 100 mol % of the alkaline earth metal element contained in the mixture, more preferably in a range of 2 mol % or more and 60 mol % or less, even more preferably in a range of 5 mol % or more and 50 mol % or less.

In the case where magnesium fluoride is used as the second flux and where the content of magnesium fluoride falls within the range, crystal growth can be promoted while reduction in the emission intensity of the resultant aluminate fluorescent material to be caused by too much amount of the first flux is prevented, and therefore an aluminate fluorescent material having a large particle size and having a high emission intensity can be produced.

Mixing of Compounds

A compound containing at least one alkaline earth metal element selected from the group consisting of Ba, Sr and Ca, a Mg-containing compound not acting as a flux, a Mn-containing compound, an Al-containing compound, a first flux containing at least one alkali metal element selected from the group consisting of Na, K, Rb and Cs, and a Mg-containing second flux are mixed to prepare a mixture. Examples of a specific composition of the intended mixture include, as a composition excluding an alkali metal element, $Ba_{1.0}Mg_{0.5}Mn_{0.5}Al_{10}O_{17}$, etc.

Compounds containing an intended element are weighed to be in a desired blend ratio, and then ground and mixed, for example, using a dry grinding machine such as a ball mill, a vibrational mill, a hammer mill, a roll mill, a jet mill or the like, or using a mortar and a muddler, or may be mixed using, for example, a mixing machine such as a ribbon blender, a Henschel mixer, a V-type blender or the like, or may be ground and mixed using both a dry grinding machine and a mixing machine. The mixing may be dry mixing or may be wet mixing using a solvent or the like added to the mixture. Dry mixing is preferred. The process time may be shortened in dry mixing than in wet mixing, therefore contributing toward improvement of productivity.

Heat Treatment of Mixture

The mixture may be heat-treated in a crucible, a boat formed of a carbon material of graphite, or a material of boron nitride (BN), aluminum oxide (alumina), tungsten (W), molybdenum (Mo), etc.

The temperature for heat-treating the mixture is, from the viewpoint of stability of crystal structure, preferably in a range of 1,000° C. or higher and 1,800° C. or lower, more preferably in a range of 1,100° C. or higher and 1, 750° C. or lower, even more preferably in a range of 1,200° C. or higher and 1,700° C. or lower, especially preferably in a range of 1,300° C. or higher and 1,650° C. or lower.

The heat treatment time varies depending on the heating rate, the heat treatment atmosphere and others, and is preferably 1 hour or more after the system has reached the heat treatment temperature, more preferably 2 hours or more, even more preferably 3 hours or more, and is preferably 20 hours or less, more preferably 18 hours or less, even more preferably 15 hours or less.

The atmosphere for heat-treating the mixture includes an inert atmosphere of argon, nitrogen, a reductive atmosphere containing hydrogen, or an oxidative atmosphere such as air, etc. Preferably, the mixture is heat-treated in a reducing nitrogen atmosphere to give a fluorescent material. The heat treatment atmosphere for the mixture is more preferably a nitrogen atmosphere containing a reductive hydrogen gas.

For the aluminate fluorescent material, the mixture can enjoy better reactivity in an atmosphere having a high reductive power such as a reductive atmosphere containing hydrogen and nitrogen, and can be heat-treated under an atmospheric pressure without pressurization. For the heat treatment, for example, an electric furnace or a gas furnace can be used.

Post-Treatment

The resultant aluminate fluorescent material may be dispersed in wet and may be post-treated by sieving in wet, dewatering, drying, sieving in dry. As a result of such a post-treatment step, an aluminate fluorescent material having a desired average particle diameter can be obtained. For example, the aluminate fluorescent material after heat treatment is dispersed in a solvent, and the dispersed fluorescent material is put on a sieve, and via the sieve, a solvent flow is applied with various modes of vibration given thereto, and thus the calcined product is mesh-sieved in wet, and then dewatered, dried, and sieved in dry to give a fluorescent material having a desired average particle diameter.

By dispersing the aluminate fluorescent material after heat treatment in a medium, impurities such as calcined residues of flux and unreacted components of raw materials can be removed. In dispersing in wet, a dispersion medium such as alumina balls, zirconia balls or the like may be used.

EXAMPLES

The present invention will now be described in detail with reference to examples, but the present invention is not limited to these examples.

Example 1

Raw materials of $BaCO_3$, $Al_2O_3$, MgO and $MnCO_3$ to give a composition represented by $Ba_{1.0}Mg_{0.5}Mn_{0.5}Al_{10}O_{17}$ as a preparation composition, and further 0.005 mol of a first flux KF, and 0.100 mol of a second flux $MgF_2$ were mixed to give a mixture.

The resultant mixture was charged in an alumina crucible, and heat-treated in a mixed atmosphere of 3% by volume of $H_2$ and 97% by volume of $N_2$ at 1,500° C. for 5 hours to give an aluminate fluorescent material.

Comparative Example 1

In the same manner as in Example 1 except that the first flux and the second flux were not used, an aluminate fluorescent material was produced.

Comparative Example 2

In the same manner as in Example 1 except that the first flux was not used, an aluminate fluorescent material was produced.

Example 2

In the same manner as in Example 1 except that 0.010 mol of KF was added as the first flux, an aluminate fluorescent material was produced.

Example 3

In the same manner as in Example 1 except that 0.030 mol of KF was added as the first flux, an aluminate fluorescent material was produced.

Example 4

In the same manner as in Example 1 except that 0.050 mol of KF was added as the first flux, an aluminate fluorescent material was produced.

Example 5

In the same manner as in Example 1 except that 0.060 mol of KF was added as the first flux, an aluminate fluorescent material was produced.

Example 6

In the same manner as in Example 1 except that 0.070 mol of KF was added as the first flux, an aluminate fluorescent material was produced.

Example 7

In the same manner as in Example 1 except that 0.100 mol of KF was added as the first flux, an aluminate fluorescent material was produced.

Example 8

In the same manner as in Example 1 except that 0.025 mol of $K_2CO_3$ was added as the first flux, an aluminate fluorescent material was produced.

Example 9

Raw materials of $BaCO_3$, $SrCO_3$, $Al_2O_3$, MgO and $MnCO_3$ to give a composition represented by $Ba_{0.7}Sr_{0.3}Mg_{0.5}Al_{10}O_{17}$ as a preparation composition, and further 0.050 mol of a first flux KF, and 0.100 mol of a second flux $MgF_2$ were mixed to give a mixture. In the same manner as in Example 1 except that this mixture was used, an aluminate fluorescent material was produced.

Example 10

In the same manner as in Example 1 except that 0.010 mol of NaF was added as the first flux, an aluminate fluorescent material was produced.

Example 11

In the same manner as in Example 1 except that 0.030 mol of NaF was added as the first flux, an aluminate fluorescent material was produced.

Example 12

In the same manner as in Example 1 except that 0.050 mol of NaF was added as the first flux, an aluminate fluorescent material was produced.

Example 13

In the same manner as in Example 1 except that 0.100 mol of NaF was added as the first flux, an aluminate fluorescent material was produced.

The following Table 1 shows preparation compositions of raw materials for the aluminate fluorescent materials of Examples 1 to 13 and Comparative Examples 1 to 2.

TABLE 1

| | Amount of Flux Added (mol) | | | | Preparation Composition (mol) | | | | |
|---|---|---|---|---|---|---|---|---|---|
| | $MgF_2$ | KF | $K_2CO_3$ | NaF | Ba | Sr | Mg | Mn | Al |
| Comparative Example 1 | — | — | — | — | 1.0 | — | 0.5 | 0.5 | 10.0 |
| Comparative Example 2 | 0.100 | — | | | | | | | |
| Example 1 | 0.100 | 0.005 | | | | | | | |
| Example 2 | 0.100 | 0.010 | | | | | | | |
| Example 3 | 0.100 | 0.030 | | | | | | | |
| Example 4 | 0.100 | 0.050 | | | | | | | |
| Example 5 | 0.100 | 0.060 | | | | | | | |
| Example 6 | 0.100 | 0.070 | | | | | | | |
| Example 7 | 0.100 | 0.100 | | | | | | | |
| Example 8 | 0.100 | — | 0.025 | | | | | | |
| Example 9 | 0.100 | 0.050 | — | | 0.7 | 0.3 | | | |
| Example 10 | 0.100 | — | | 0.010 | 1.0 | — | | | |
| Example 11 | 0.100 | | | 0.030 | | | | | |
| Example 12 | 0.100 | | | 0.050 | | | | | |
| Example 13 | 0.100 | | | 0.100 | | | | | |

Composition Analysis

The aluminate fluorescent materials of Examples and Comparative Examples were analyzed through ICP emission spectrometry using an inductively coupled plasma emission spectrometer (manufactured by Perkin Elmer Inc.) to measure the Ba amount, the Sr amount, the Mg amount, the Mn amount, the Al amount and the Mn amount. In addition, using an atomic absorption spectrophotometer (manufactured by Hitachi High-Technologies Corporation), the Na amount and the K amount were measured according to atomic absorption spectrophotometry. The results are shown in Table 2.

Emission Spectrometry

The fluorescent materials of Examples and Comparative Examples were analyzed to measure the emission characteristics thereof. Using a quantum efficiency measuring device (QE-2000, manufactured by Otsuka Electronics Co., Ltd.), each fluorescent material was irradiated with light having an excitation wavelength of 450 nm to measure the emission spectrum thereof at room temperature (25° C.±5° C.).

Figure 2:
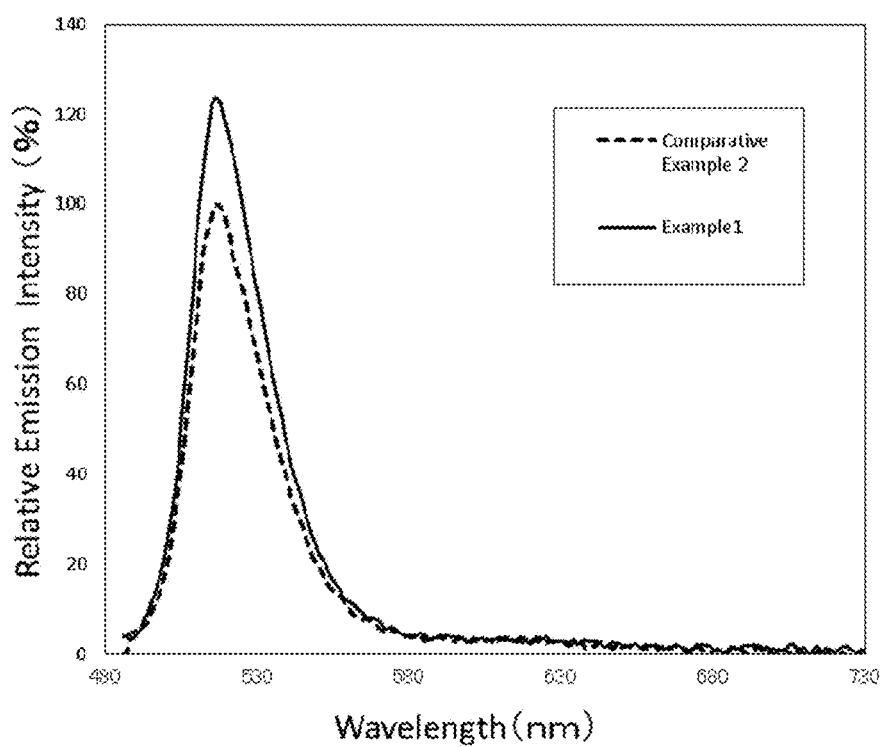
FIG. 2 shows an emission spectrum of aluminate fluorescent materials according to an example of the present disclosure and a comparative example of the present disclosure.

FIG. 2 shows emission spectra of a relative emission intensity (%) relative to a wavelength of the aluminate fluorescent material of Example 1 and of the aluminate fluorescent material of Comparative Example 2.

Relative Emission Intensity (%)

Regarding the fluorescent materials of Examples and Comparative Examples, the emission intensity at the emission peak wavelength of the resultant fluorescent material was calculated as a relative emission intensity relative to the emission intensity, 100% at the emission peak wavelength of the fluorescent material of Comparative Example 2. The results are shown in Table 3.

Emission Peak Wavelength

Regarding the fluorescent materials of Examples and Comparative Examples, the wavelength at which the emission spectrum of the fluorescent material showed a peak was referred to as the emission peak wavelength (nm) thereof. The results are shown in Table 3.

Full-Width at Half-Maximum: FWHM

Regarding the fluorescent materials of Examples and Comparative Examples, the full-width at half-maximum (FWHM) of the emission spectrum of the fluorescent material was measured. The results are shown in Table 3.

Measurement of Average Particle Diameter

Regarding the aluminate fluorescent materials of Examples and Comparative Examples, the average particle diameter thereof to reach 50% volume cumulative frequency from the small particle size side was measured with a laser diffractometric particle sizer (for example, MASTER SIZER 3000 manufactured by Malvern Instruments Ltd.) (Dm: median diameter). The results are shown in Table 3.

X-ray Diffractometry

Figure 3:
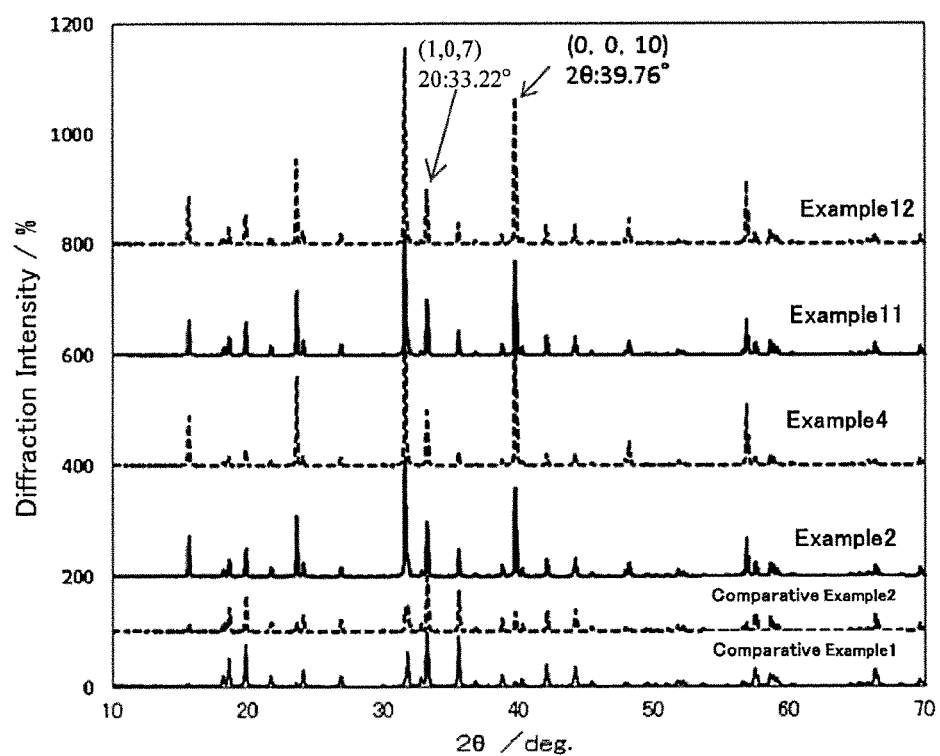
FIG. 3 shows an XRD diffraction pattern, as measured using a CuK ray, of aluminate fluorescent materials of examples and comparative examples of the present disclosure.
Figure 4:
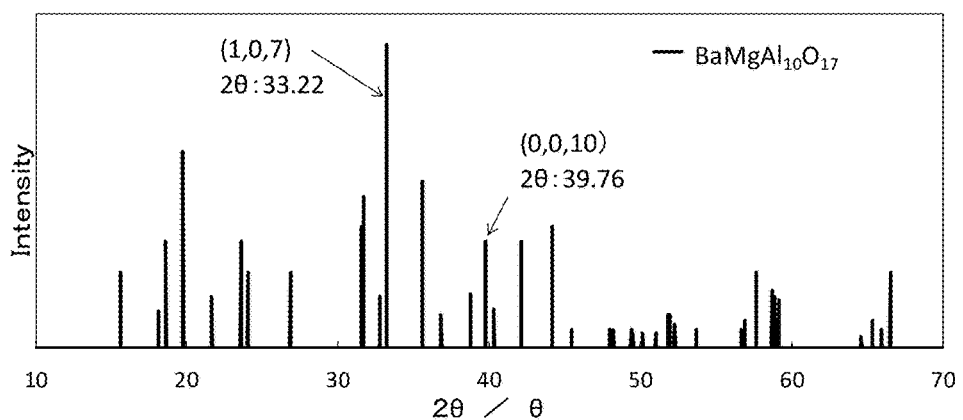
FIG. 4 shows an X-ray diffraction pattern, as measured using a CuKα ray, of $BaMgAl_{10}O_{17}$ shown in ICDD data No. 00-026-0163 in International Center for Diffraction.

The fluorescent materials of Examples and Comparative Examples were analyzed through X-ray diffractometry (XRD). For the measurement, a horizontal multipurpose X-ray diffractometer (product name: Ultima IV, by Rigaku Corporation) was used with a CuKα ray. Examples of the resultant XRD patterns are shown in FIG. 3. In FIG. 3, the XRD patterns of aluminate fluorescent materials of Example 12, Example 11, Example 4, Example 2, Comparative Example 2 and Comparative Example 1 are shown in that order from the above. In FIG. 4, the X-ray diffraction pattern measured with a CuKα ray of $BaMgAl_{10}O_{17}$ shown in ICDD data No. 00-026-0163 in International Center for Diffraction is shown as a reference example.

($I_B/I_A$ Ratio)

Regarding the fluorescent materials of Examples and Comparative Examples, the ratio ($I_B/I_A$) of the diffraction intensity Is of a peak of a plane (0,0,10) at 2θ of 39.76° in an X-ray diffraction pattern measured with a CuKα ray to the diffraction intensity $I_A$ of a peak of a plane (1,0,7) at 2θ of 33.22° in the X-ray diffraction pattern was calculated.

SEM Micrograph

Figure 5:
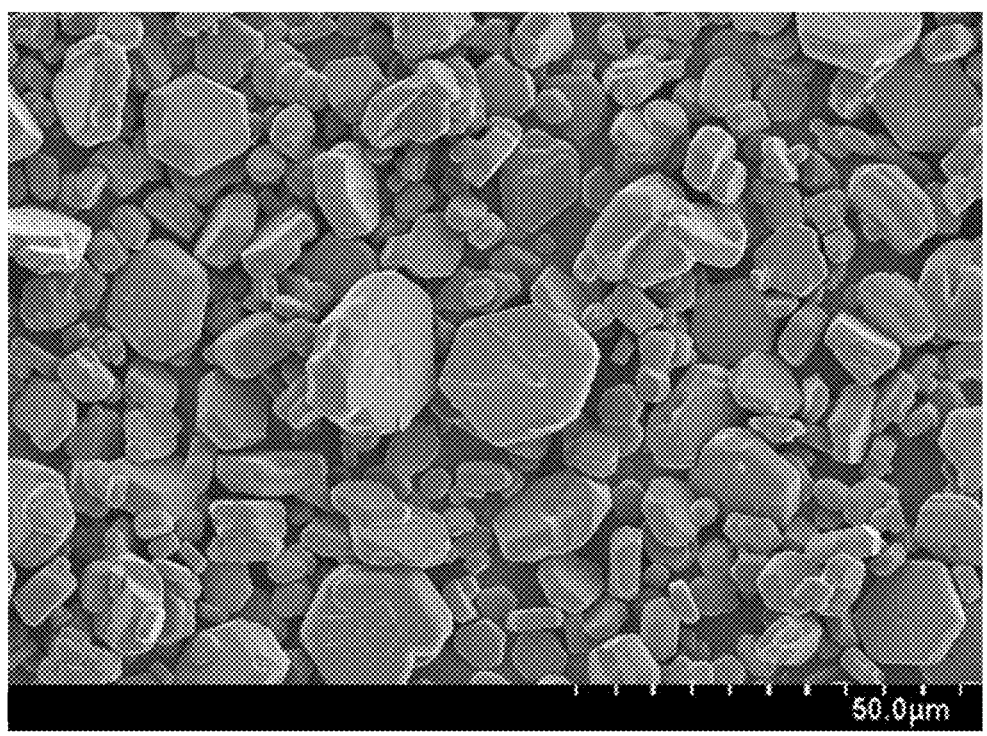
FIG. 5 is a SEM micrograph of the aluminate fluorescent material of an example of the present disclosure.
Figure 6:
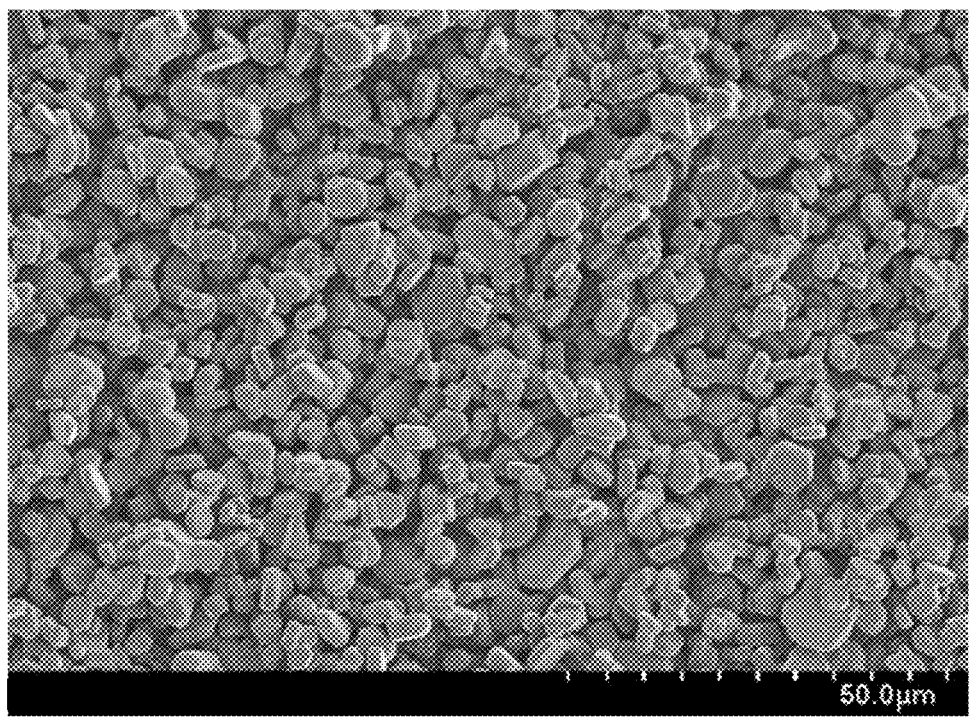
FIG. 6 is a SEM micrograph of the aluminate fluorescent material of a comparative example of the present disclosure.

Using a scanning electron microscope (SEM), a SEM micrographs of the aluminate fluorescent material of Example 1 and that of the aluminate fluorescent material of Comparative Example 2 were taken. FIG. 5 shows the SEM micrograph of the aluminate fluorescent material of Example 1, and FIG. 6 shows the SEM micrograph of the aluminate fluorescent material of Comparative Example 2.

TABLE 2

| | Na Content (ppm) | K Content (ppm) | Analytical Compositional Ratio (mol) | | | | | | |
|---|---|---|---|---|---|---|---|---|---|
| | | | Ba | Sr | Mg | Mn | Al | Na | K |
| Comparative Example 1 | — | <10 | 0.970 | — | 0.472 | 0.495 | 9.850 | — | 0.0000 |
| Comparative Example 2 | | <10 | 0.975 | | 0.469 | 0.467 | 9.850 | | 0.0000 |
| Example 1 | | 25 | 0.978 | | 0.468 | 0.466 | 9.850 | | 0.0005 |
| Example 2 | | 170 | 0.973 | | 0.468 | 0.466 | 9.850 | | 0.0031 |
| Example 3 | | 330 | 0.978 | | 0.468 | 0.466 | 9.850 | | 0.0060 |
| Example 4 | | 500 | 0.975 | | 0.467 | 0.477 | 9.850 | | 0.0091 |
| Example 5 | | 850 | 0.970 | | 0.501 | 0.482 | 9.850 | | 0.0156 |
| Example 6 | | 740 | 0.978 | | 0.502 | 0.484 | 9.850 | | 0.0136 |
| Example 7 | | 1100 | 0.947 | | 0.470 | 0.481 | 9.850 | | 0.0201 |
| Example 8 | | 730 | 0.975 | | 0.498 | 0.480 | 9.850 | | 0.0133 |
| Example 9 | | 700 | 0.688 | 0.279 | 0.489 | 0.471 | 9.850 | | 0.0125 |
| Example 10 | 290 | — | 0.983 | — | 0.497 | 0.479 | 9.850 | 0.0090 | — |
| Example 11 | 430 | | 0.983 | | 0.497 | 0.479 | 9.850 | 0.0133 | |
| Example 12 | 700 | | 0.978 | | 0.497 | 0.479 | 9.850 | 0.0216 | |
| Example 13 | 1000 | | 0.950 | | 0.493 | 0.449 | 9.850 | 0.0307 | |

TABLE 3

| | Diffraction Intensity Ratio ($I_B/I_A$) | Relative Emission Intensity (%) | Emission Peak Wavelength (nm) | Full-Width at Half-Maximum (FWHM) (nm) | Average Particle Diameter (μm) |
|---|---|---|---|---|---|
| Comparative Example 1 | 0.10 | 37.0 | 516 | 28 | 4.6 |
| Comparative Example 2 | 0.34 | 100.0 | 517 | 29 | 9.2 |
| Example 1 | 0.48 | 117.2 | 516 | 28 | 13.2 |
| Example 2 | 1.60 | 123.7 | 516 | 29 | 14.6 |
| Example 3 | 3.66 | 144.4 | 516 | 29 | 19.2 |
| Example 4 | 2.64 | 148.4 | 517 | 28 | 21.3 |
| Example 5 | 4.72 | 142.2 | 517 | 28 | 20.9 |
| Example 6 | 3.83 | 142.4 | 517 | 28 | 20.7 |
| Example 7 | 5.85 | 135.7 | 518 | 28 | 21.7 |
| Example 8 | 2.15 | 142.0 | 518 | 28 | 19.9 |
| Example 9 | 3.20 | 142.6 | 518 | 29 | 18.9 |
| Example 10 | 1.05 | 115.2 | 517 | 28 | 13.5 |
| Example 11 | 1.68 | 135.6 | 517 | 28 | 16.4 |
| Example 12 | 2.68 | 137.1 | 517 | 28 | 16.2 |
| Example 13 | 3.52 | 134.7 | 517 | 28 | 15.5 |

As shown in Table 3, the ratio ($I_B/I_A$) of the peak diffraction intensity $I_B$ of a plane (0,0,10) to the peak diffraction intensity $I_A$ of a plane (1.0,7) in the X-ray diffraction pattern of the aluminate fluorescent materials of Examples 1 to 13 was within a range of 0.4 to 10.

As shown in Table 3 and FIG. 2, the relative emission intensity of the aluminate fluorescent material of each of Examples 1 to 13 was higher by 10% or more than that of the fluorescent material of Comparative Example 2.

As shown in Table 3, the aluminate fluorescent materials of Examples 1 to 13 realized crystal growth as produced using the first flux containing an alkali metal element and a Mg-containing second flux, and in these, the crystals grew in the c-axis direction in the hexagonal crystal structure as using the first flux, and accordingly, these fluorescent materials have a large average particle diameter of more than 10.0 μm and have an increased emission intensity.

Also as shown in Table 3, the full-width at half-maximum of the emission peak in the emission spectrum excited with a light having an emission peak wavelength of 450 nm of the aluminate fluorescent material of each of Examples 1 to 13 is less than 30 nm and is small and the full-width at half-maximum of the emission peak in the emission spectrum thereof is narrow, which confirm high color purity of these fluorescent materials.

Regarding the aluminate fluorescent material of Comparative Example 1 produced using neither a first flux nor a second flux, the average particle diameter was small and the relative emission intensity was low.

Regarding the aluminate fluorescent material of Comparative Example 2 produced using only a second flux but not using a first flux, the relative emission intensity was lower than that in Examples though the average particle diameter was larger than that in Comparative Example 1.

As shown in FIG. 3, the X-ray diffraction patterns of Examples and Comparative Examples measured using a CuKα ray gave peaks at the same positions as those in the ICDD data of $BaMgAl_{10}O_{17}$ shown in FIG. 4, that is, the patterns exhibited a peak of the (1,0,7) plane at 2θ of 33.22° and a peak of the (0,0,10) plane at 2θ of 39.76°.

As shown in FIG. 3, in the X-ray diffraction patterns of Examples 2, 4, 11 and 12 the peak diffraction intensity in the (1,0,7) plane at 2θ of 33.22° and the peak diffraction intensity in the (0,0,10) plane at 2θ of 39.76° are higher than those in the X-ray diffraction patterns of Comparative Examples 1 and 2, that is, the diffraction intensity in the c-axis direction in the former is higher, therefore confirming the crystal growth in the c-axis direction in the former.

The SEM micrograph of the aluminate fluorescent material of Example 1 shown in FIG. 5 and the SEM micrograph of the aluminate fluorescent material of Comparative Example 2 in FIG. 6 are compared. It is shown that the particle size of the aluminate fluorescent material of Example 1 is larger as a whole than that of the aluminate fluorescent material of Comparative Example 2. The aluminate fluorescent material of Example 1 was produced using the first flux containing an alkali metal element and the Mg-containing second flux, and therefore, it is confirmed that the crystals of the material grew and the particle size thereof became larger than that of the aluminate fluorescent material of Comparative Example 2.

The aluminate fluorescent material obtained according to the production method of an embodiment of the present invention has a high emission intensity, and the light emitting device using the aluminate fluorescent material of an embodiment of the present invention can be used in a wide variety of ordinary lightings, in-car lightings, displays, backlights for liquid crystals, traffic lights, lighting switches, etc.

The invention claimed is:

1. An aluminate fluorescent material comprising a composition of an aluminate that comprises at least one alkaline earth metal element selected from the group consisting of Ba, Sr and Ca, at least one alkali metal element selected from the group consisting of Na, K, Rb and Cs, and Mg and Mn, and having a ratio ($I_B/I_A$) of a diffraction intensity $I_B$ of a peak of a plane (0,0,10) at a diffraction angle 2θ of 39.76° in an X-ray diffraction pattern measured with a CuKα ray to a diffraction intensity $I_A$ of a peak of a plane (1,0,7) at a diffraction angle 2θ of 33.22° in the X-ray diffraction pattern in a range of 0.4 or more and 10 or less.

2. The aluminate fluorescent material according to claim 1, wherein the content of the at least one alkali metal element is in a range of 20 ppm or more and 3,000 ppm or less.

3. The aluminate fluorescent material according to claim 1, wherein the at least one alkaline earth metal element contains Ba.

4. The aluminate fluorescent material according to claim 1, wherein the at least one alkali metal element contains Na and/or K.

5. The aluminate fluorescent material according to claim 1, having an average particle diameter of 5.0 μm or more.

6. A light emitting device comprising the aluminate fluorescent material of claim 1 and an excitation light source having an emission peak wavelength in a range of 380 nm or more and 485 nm or less.

7. An aluminate fluorescent material comprising a composition represented by the following formula (I):

$$X1_a X2_e Mg_b Mn_c Al_d O_{a+b+c+1.5d+0.5e} \qquad (I)$$

wherein X1 represents at least one alkaline earth metal element selected from the group consisting of Ba, Sr and Ca, X2 represents at least one alkali metal element selected from the group consisting of Na, K, Rb and Cs, and a, b, c, d and e satisfy 0.5≤a≤1.0, 0.4≤b≤0.7, 0.3≤c≤0.7, 0.7≤b+c≤1.0, 9.0≤d≤13.0, 10.0≤d/a≤20.0, and 0.0<e≤0.1.

8. The aluminate fluorescent material according to claim 7, having an average particle diameter of 5.0 μm or more.

9. A light emitting device comprising the aluminate fluorescent material of claim 7 and an excitation light source having an emission peak wavelength in a range of 380 nm or more and 485 nm or less.

* * * * *